(12) United States Patent
Sunohara et al.

(10) Patent No.: US 7,494,898 B2
(45) Date of Patent: Feb. 24, 2009

(54) METHOD FOR MANUFACTURING SEMICONDUCTOR DEVICE

(75) Inventors: Masahiro Sunohara, Nagano (JP); Yuichi Taguchi, Nagano (JP); Akinori Shiraishi, Nagano (JP); Naoyuki Koizumi, Nagano (JP); Kei Murayama, Nagano (JP); Hideaki Sakaguchi, Nagano (JP); Mitsutoshi Higashi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 124 days.

(21) Appl. No.: 11/641,336

(22) Filed: Dec. 19, 2006

(65) Prior Publication Data

US 2007/0161211 A1    Jul. 12, 2007

(30) Foreign Application Priority Data

Jan. 6, 2006    (JP)    ............................. 2006-001802

(51) Int. Cl.
*H01L 21/00*    (2006.01)
(52) U.S. Cl. .................. 438/455; 438/458; 438/106
(58) Field of Classification Search ................ 438/458, 438/455, 106
See application file for complete search history.

(56) References Cited

U.S. PATENT DOCUMENTS

| | | | |
|---|---|---|---|
| 6,413,839 B1 * | 7/2002 | Brown et al. ................. | 438/463 |
| 6,467,666 B2 | 10/2002 | Ichikawa et al. | |
| 6,573,028 B1 * | 6/2003 | Yamamoto et al. .......... | 430/311 |
| 6,580,054 B1 * | 6/2003 | Liu et al. ................ | 219/121.68 |
| 6,733,954 B2 * | 5/2004 | Yamamoto et al. .......... | 430/311 |
| 6,806,544 B2 * | 10/2004 | Liu ............................ | 257/414 |
| 6,849,524 B2 * | 2/2005 | Shelton et al. .............. | 438/465 |
| 6,902,990 B2 * | 6/2005 | Gottfried et al. ............ | 438/463 |
| 6,949,449 B2 * | 9/2005 | Swenson et al. ............ | 438/463 |
| 6,960,739 B2 * | 11/2005 | Liu et al. ................ | 219/121.69 |
| 6,960,813 B2 * | 11/2005 | Liu ............................ | 257/414 |
| 6,995,032 B2 * | 2/2006 | Bruhns et al. ................. | 438/33 |
| 7,008,861 B2 * | 3/2006 | Andrews et al. ............ | 438/463 |
| 7,052,976 B2 * | 5/2006 | Liu ............................. | 438/460 |
| 7,087,463 B2 * | 8/2006 | Sackrison et al. ........... | 438/113 |
| 7,112,518 B2 * | 9/2006 | Liu ............................. | 438/487 |
| 7,160,747 B2 * | 1/2007 | Haberern et al. .............. | 438/39 |
| 7,169,688 B2 * | 1/2007 | Liu ............................. | 438/463 |
| 7,202,141 B2 * | 4/2007 | Park et al. .................... | 438/458 |
| 7,235,430 B2 * | 6/2007 | Romano et al. ............. | 438/122 |
| 7,241,667 B2 * | 7/2007 | Park et al. .................... | 438/458 |
| 7,241,669 B2 * | 7/2007 | Swenson et al. ............ | 438/463 |

(Continued)

FOREIGN PATENT DOCUMENTS

JP    2001-345289    12/2001

(Continued)

*Primary Examiner*—Laura M Menz
(74) *Attorney, Agent, or Firm*—Ladas & Parry LLP

(57) ABSTRACT

A disclosed method for manufacturing a semiconductor device having a structure where a semiconductor element is mounted on a first substrate includes the steps of: bonding the first substrate on which the semiconductor element is mounted and a second substrate made of a material different from a material of the first substrate so as to encapsulate the semiconductor element; forming a first groove in the first substrate and a second groove in the second substrate; and cleaving a portion between the first groove and the second groove so as to individualize the semiconductor device.

6 Claims, 15 Drawing Sheets

U.S. PATENT DOCUMENTS

| | | | |
|---|---|---|---|
| 7,306,975 B2 * | 12/2007 | Harris, Jr. | 438/113 |
| 7,329,569 B2 * | 2/2008 | Haberern et al. | 438/164 |
| 7,368,756 B2 * | 5/2008 | Bruhns et al. | 257/93 |
| 7,378,288 B2 * | 5/2008 | Tran et al. | 438/12 |
| 7,388,172 B2 * | 6/2008 | Sercel et al. | 219/121.72 |
| 2002/0127824 A1 * | 9/2002 | Shelton et al. | 438/463 |
| 2003/0003690 A1 * | 1/2003 | Nering et al. | 438/463 |
| 2003/0157437 A1 * | 8/2003 | Yamamoto et al. | 430/311 |
| 2004/0228004 A1 * | 11/2004 | Sercel et al. | 359/668 |
| 2005/0003634 A1 * | 1/2005 | Brown et al. | 438/463 |
| 2005/0087756 A1 | 4/2005 | Shiraishi | |
| 2005/0263854 A1 * | 12/2005 | Shelton et al. | 257/615 |
| 2007/0148803 A1 * | 6/2007 | Yakushiji et al. | 438/33 |
| 2007/0161211 A1 * | 7/2007 | Sunohara et al. | 438/455 |
| 2008/0121906 A1 * | 5/2008 | Yakushiji | 257/94 |

FOREIGN PATENT DOCUMENTS

JP     2005-129643     5/2005

* cited by examiner (PRIOR ART)

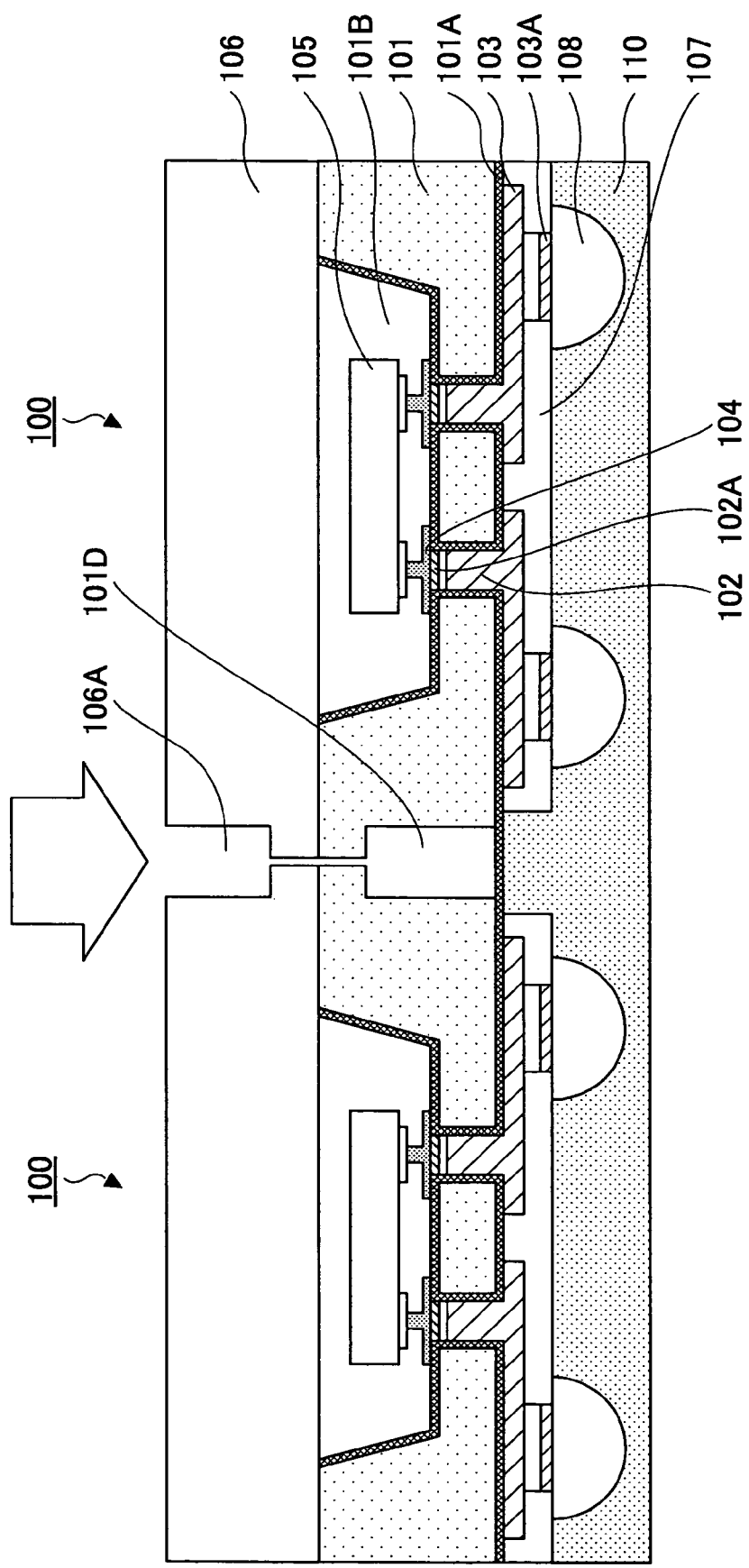

METHOD FOR MANUFACTURING SEMICONDUCTOR DEVICE

BACKGROUND OF THE INVENTION

1. Field of the Invention

The present invention relates to a method for manufacturing a semiconductor device in which a light-emitting element is mounted on a substrate.

2. Description of the Related Art

Upon manufacturing a semiconductor device in which a semiconductor element is mounted on a substrate, for example, a method for forming plural semiconductor devices is employed in some cases. In such cases, plural semiconductor elements are mounted on a substrate, the substrate is cut and the plural semiconductor elements are individualized, so that plural semiconductor devices are formed. Generally, the substrate is cut (individualization) by dicing, for example (refer to Patent Document 1). Dicing is a method for cutting a substrate using a blade rotating at a high speed.

Patent Document 1: Japanese Laid-Open Patent Application No. 2005-129643

Patent Document 2: Japanese Laid-Open Patent Application No. 2001-345289

However, when the substrate is cut by dicing, a fracture referred to as chipping may be generated in the substrate since the blade rotating at a high speed is used. This is problematic in that reliability of semiconductor devices is reduced.

In particular, when cutting a structure in which plural substrates are bonded, it is necessary to use different blades for different materials depending on the materials of the substrates in some cases. In accordance with this, a difference in level is generated in a cut surface, so that chipping is likely to be generated in some cases.

For example, FIGS. 1A and 1B are diagrams schematically showing that a substrate 1 and a substrate 2 that have been bonded are cut by dicing.

First, FIG. 1A shows that the substrate 1 is cut by dicing from the bonded substrate 1 and substrate 2 placed on a dicing tape 3. An opening portion 1A is formed in the substrate 1.

Next, FIG. 1B shows that the substrate 2 is cut using a blade differing from the step of FIG. 1A and an opening portion 2A is formed when materials of the substrate 2 are different from those of the substrate 1. In this case, a structure in which the substrate 1 and the substrate 2 are bonded is cut and individualized. However, in a step shown in FIG. 1B, it is necessary to use a blade smaller than a width of the opening portion 1A, so that a corner 1B is formed on a bottom of the opening portion 1A.

In accordance with this, the corner 1B is likely to be fractured from chipping in some cases. Further, when chipping is generated in a semiconductor device, a crack or failure resulting from the chipping may be generated, so that reliability of the semiconductor device is reduced in some cases.

The above-mentioned Patent Document 2 (Japanese Laid-Open Patent Application No. 2001-345289) discloses a method for individualizing semiconductor devices through cleavage. However, as shown in FIGS. 1A and 1B, no resolution is disclosed regarding the problems of the cases where the structure in which different materials are bonded is individualized.

SUMMARY OF THE INVENTION

It is a general object of the present invention to provide an improved and useful method for manufacturing a semiconductor device in which the above-mentioned problems are eliminated.

A more specific object of the present invention is to provide a method for manufacturing a semiconductor device that can prevent the generation of chipping upon cutting substrates and achieve preferable reliability.

According to the present invention, there is provided a method for manufacturing a semiconductor device having a structure where a semiconductor element is mounted on a first substrate, the method comprising the steps of: bonding the first substrate on which the semiconductor element is mounted and a second substrate made of a material different from a material of the first substrate so as to encapsulate the semiconductor element; forming a first groove in the first substrate and a second groove in the second substrate; and cleaving a portion between the first groove and the second groove so as to individualize the semiconductor device.

According to the above-mentioned method for manufacturing a semiconductor device, it is possible to prevent the generation of chipping when cutting substrates and to manufacture a semiconductor device with preferable reliability.

Preferably, the semiconductor element is made of an optical functional element in order to perform light emission or light reception using the semiconductor element.

Preferably, the second substrate is made of an optically transparent material in order to readily perform the light emission or the light reception using the semiconductor element.

Preferably, the first substrate and the second substrate are bonded by anodic bonding in order to encapsulate the semiconductor element in a clean manner.

Preferably, the above-mentioned method further includes the step of forming through-hole wiring so as to penetrate the first substrate and the semiconductor element is mounted so as to be connected to the through-hole wiring. In accordance with this, it is readily possible to connect the semiconductor element to a connection object of the semiconductor element.

Preferably, a concave portion on which the semiconductor element is mounted is formed on the first substrate and the semiconductor element is encapsulated by bonding a periphery of the concave portion to the second substrate. In accordance with this, it is readily possible to encapsulate the semiconductor device.

According to the present invention, it is possible to prevent the generation of chipping upon cutting substrates and to manufacture a semiconductor device with preferable reliability.

Other objects, features and advantage of the present invention will become more apparent from the following detailed description when read in conjunction with the accompanying drawings.

BRIEF DESCRIPTION OF THE DRAWINGS

FIG. 2M is a (thirteen) diagram showing a method for manufacturing a semiconductor device according to example 1 of the present invention.

DETAILED DESCRIPTION OF THE PREFERRED EMBODIMENTS

Figure 1A:
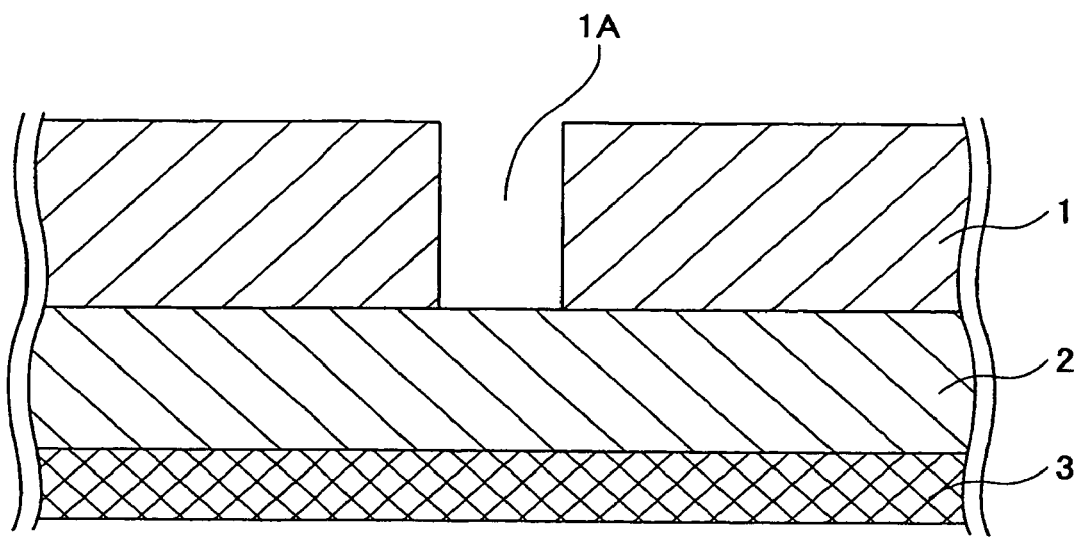
FIG. 1A is a (first) diagram showing a conventional method for cutting substrates.
Figure 1B:
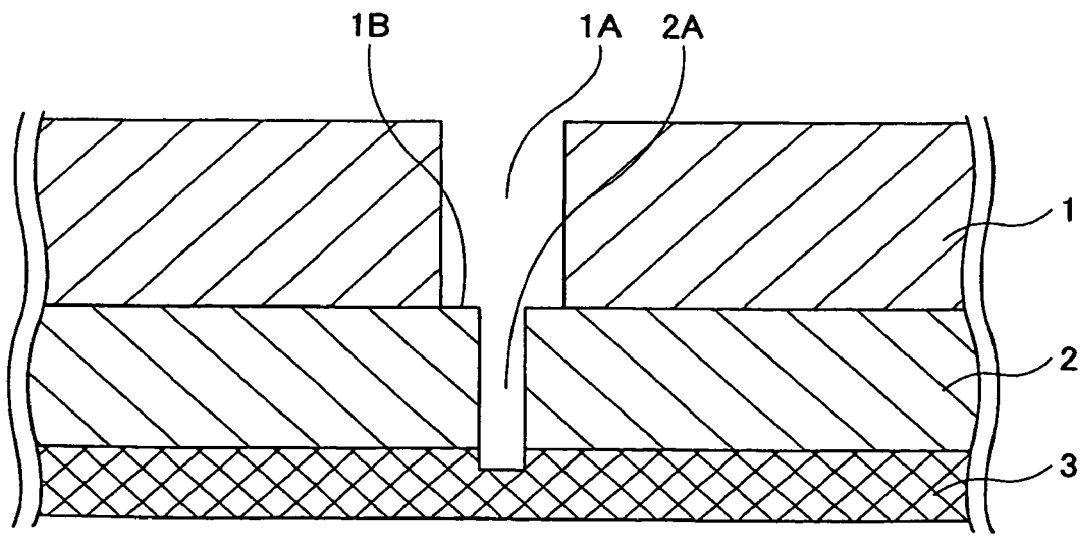
FIG. 1B is a (second) diagram showing a conventional method for cutting substrates.

In the following, embodiments of the present invention will be described with reference to the accompanying drawings.

According to the present invention, a method for manufacturing a semiconductor device having a structure where a semiconductor element is mounted on a first substrate comprises the steps of: bonding the first substrate on which the semiconductor element is mounted and a second substrate made of a material different from a material of the first substrate so as to encapsulate the semiconductor element; forming a first groove in the first substrate and a second groove in the second substrate; and cleaving a portion between the first groove and the second groove so as to individualize the semiconductor device.

Conventionally, when a substrate is cut, dicing using a blade rotating at a high speed is generally employed, so that chipping is likely to be generated in the substrate. In particular, in a structure in which substrates made of different materials are bonded, it is necessary to use different blades in some cases. As a result, chipping is more likely to be generated, so that reliability of a semiconductor device may be reduced in some cases.

By contrast, in the method for manufacturing a semiconductor device according to the present invention, when a structure in which a first substrate and a second substrate made of different materials are bonded is individualized, a first groove is formed on the first substrate, a second groove is formed on the second substrate, and then a portion between the first groove and the second groove is cleaved.

In accordance with this, it is possible to prevent the generation of chipping on the substrates and to prevent the generation of a crack or failure resulting from the chipping. Thus, it is possible to manufacture a semiconductor device with preferable reliability.

The method for manufacturing a semiconductor device according to the present invention is capable of manufacturing various types of semiconductor devices. In the following, an example of an embodiment of the present invention is described with reference to the drawings.

EXAMPLE 1

FIGS. 2A to 2H are diagrams showing a procedure of the method for manufacturing a semiconductor device according to example 1 of the present invention. The same reference numerals are assigned to elements described in preceding drawings and description thereof is omitted in some cases.

Figure 2A:
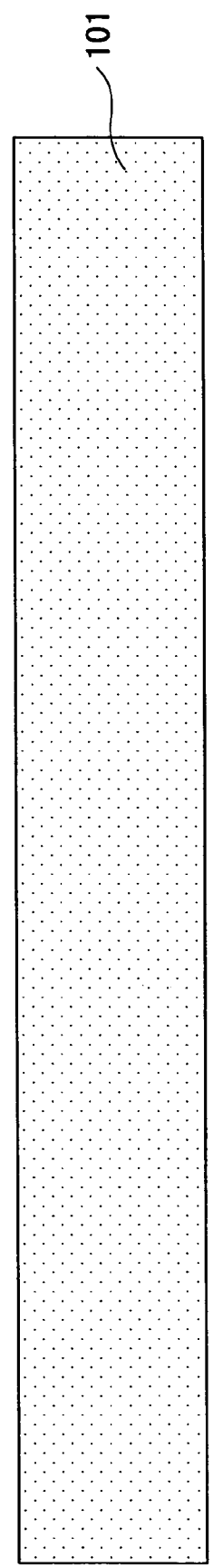
FIG. 2A is a (first) diagram showing a method for manufacturing a semiconductor device according to example 1 of the present invention.

First, in a step shown in FIG. 2A, a substrate (a first substrate) 101 made of Si is prepared, for example. In addition, the substrate 101 may be ground so as to have a predetermined thickness (about 200 μm, for example) as appropriate.

Figure 2B:
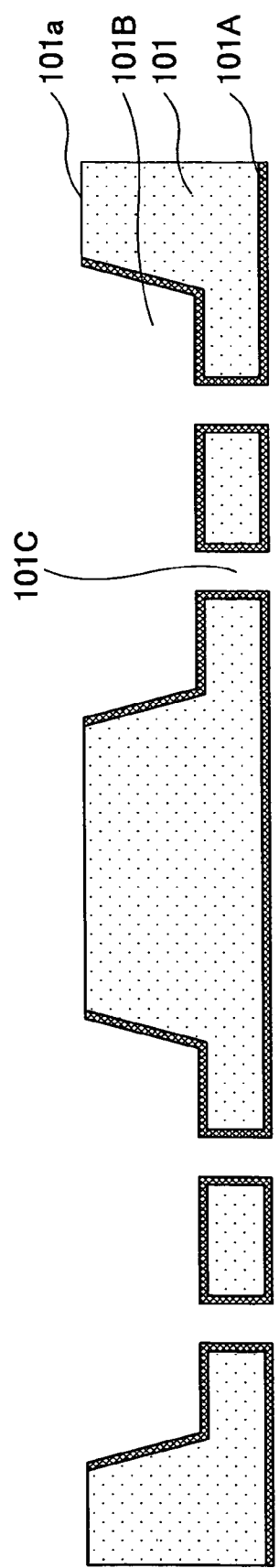
FIG. 2B is a (second) diagram showing a method for manufacturing a semiconductor device according to example 1 of the present invention.

Next, in a step shown in FIG. 2B, there are formed plural concave portions 101B for mounting (encapsulating) a semiconductor element in a later step and plural via holes 101C for penetrating each bottom of the plural concave portions 101B. Upon forming the concave portions 101B and the via holes 101C, a mask made of patterned resist is formed on the substrate 101, and then the concave portions 101B and the via holes 101C are formed by RIE (reactive ion etching), for example. Further, an insulating film 101A made of a silicon oxide film is formed by oxidizing a surface of the substrate 101 including an inner wall surface of the via hole 101C. Preferably, the oxide film 101A on a bonding surface 101a on the periphery of the concave portion, to which other substrate (glass) is bonded in a later step is removed by abrasion or the like. Moreover, the oxide film on the bonding surface 101a may be removed in a later step.

Figure 2C:
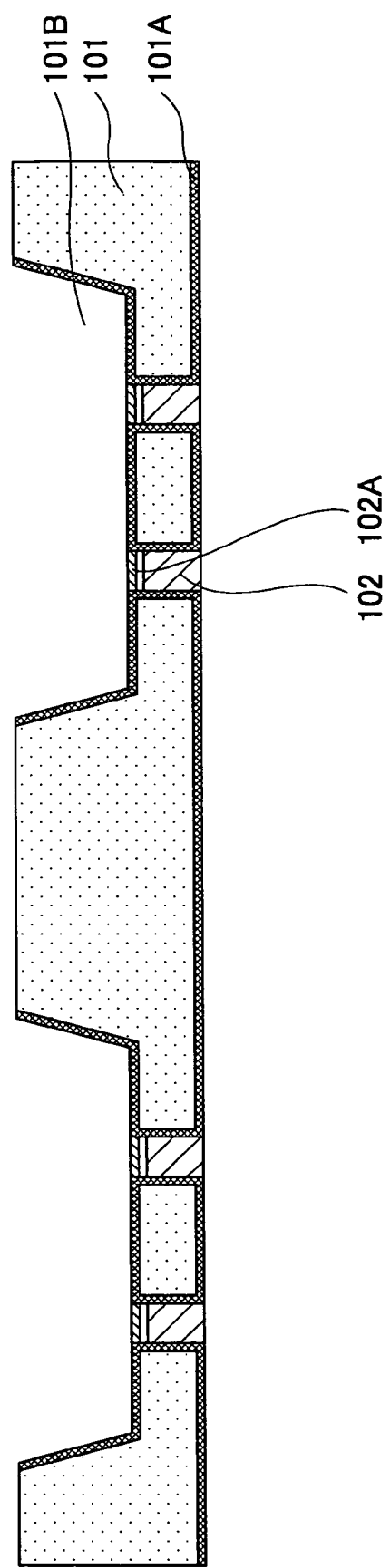
FIG. 2C is a (third) diagram showing a method for manufacturing a semiconductor device according to example 1 of the present invention.

Next, in a step shown in FIG. 2C, there are formed a via plug 102 (made of Cu) in the via hole 101C and a connection layer 102A made of a Ni/Au layer on the via plug 102 through a plating method, for example. The connection layer 102A made of Ni/Au refers to a layer in which a Au layer and a Ni layer are laminated such that the Au layer is formed on a surface (a connection surface) of the connection layer 102A. In the afore-mentioned plating method, a seed layer (a power supply layer not shown in the drawings) is formed on a surface of the insulating film 101A, and then the via plug 102 and the connection layer 102A are formed on the seed layer by electrolytic plating, for example. Thereafter, the residual seed layer is removed by etching.

Figure 2D:
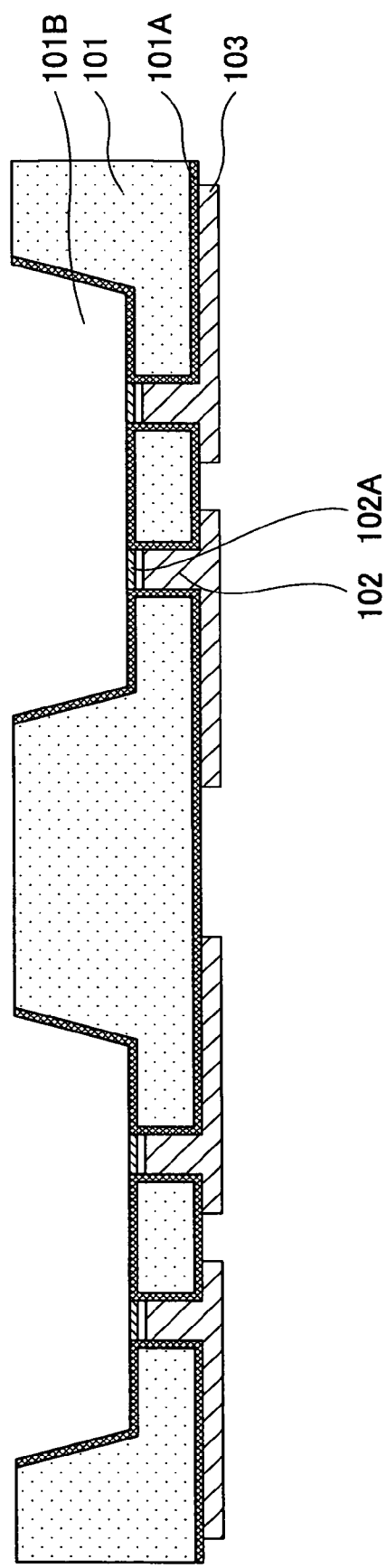
FIG. 2D is a (fourth) diagram showing a method for manufacturing a semiconductor device according to example 1 of the present invention.

Next, in a step shown in FIG. 2D, there is formed pattern wiring 103 to be connected to the via plug 102 on a rear face of the substrate 101 (an opposite side of where the connection layer 102A is formed).

Upon forming the pattern wiring 103, first, a seed layer (not shown in the drawings) is formed on the surface of the insulating film 101A, and a resist pattern (not shown in the drawings) made through patterning is formed on the seed layer by photolithography. Thereafter, the pattern wiring 103 is formed by electrolytic plating using the resist pattern as a mask and the resist pattern is removed. Then, the seed layer exposed resulting from the removal of the resist pattern is removed by etching.

Figure 2E:
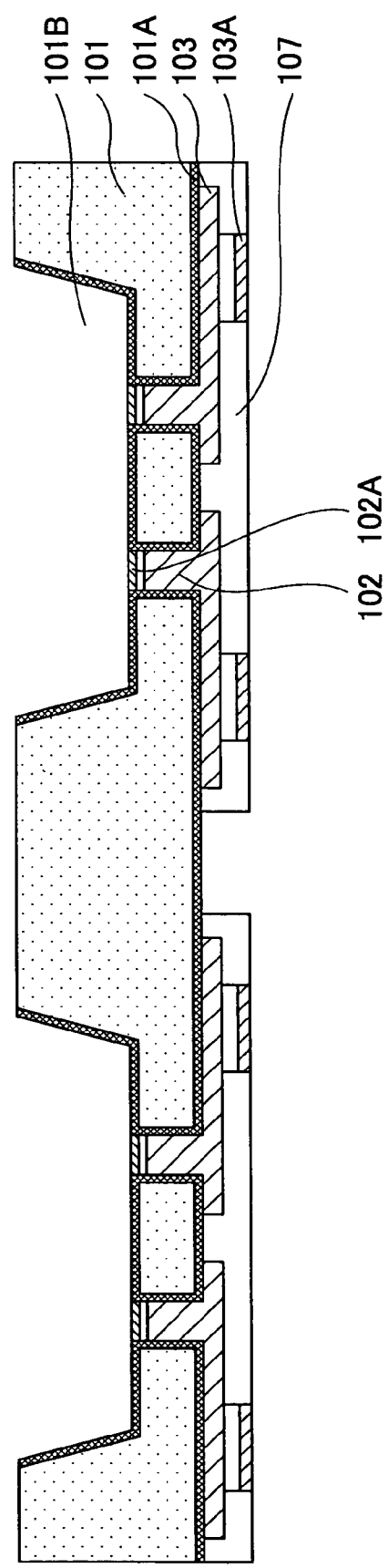
FIG. 2E is a (fifth) diagram showing a method for manufacturing a semiconductor device according to example 1 of the present invention.

Next, in a step shown in FIG. 2E, there is formed a solder resist layer 107 on the rear face of the substrate 101 such that a portion of the pattern wiring 103 is exposed. Then, a connection layer 103A made of Ni/Au is formed on the exposed pattern wiring 103 by nonelectrolytic plating, for example.

Figure 2F:
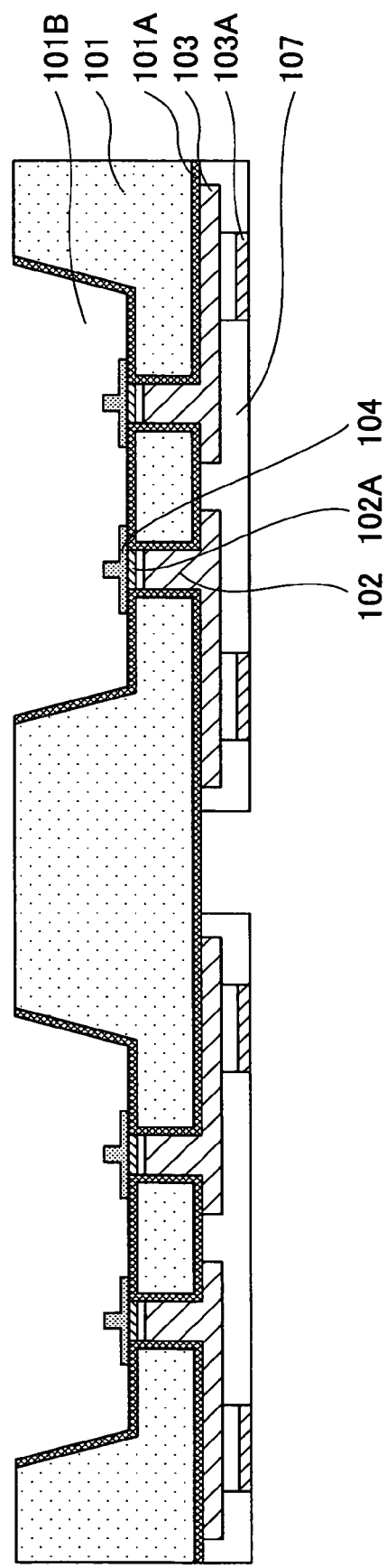
FIG. 2F is a (sixth) diagram showing a method for manufacturing a semiconductor device according to example 1 of the present invention.

Next, in a step shown in FIG. 2F, a bump 104 made of a Au bonding wire by wire bonding method, for example, is disposed on the connection layer 102A.

Figure 2G:
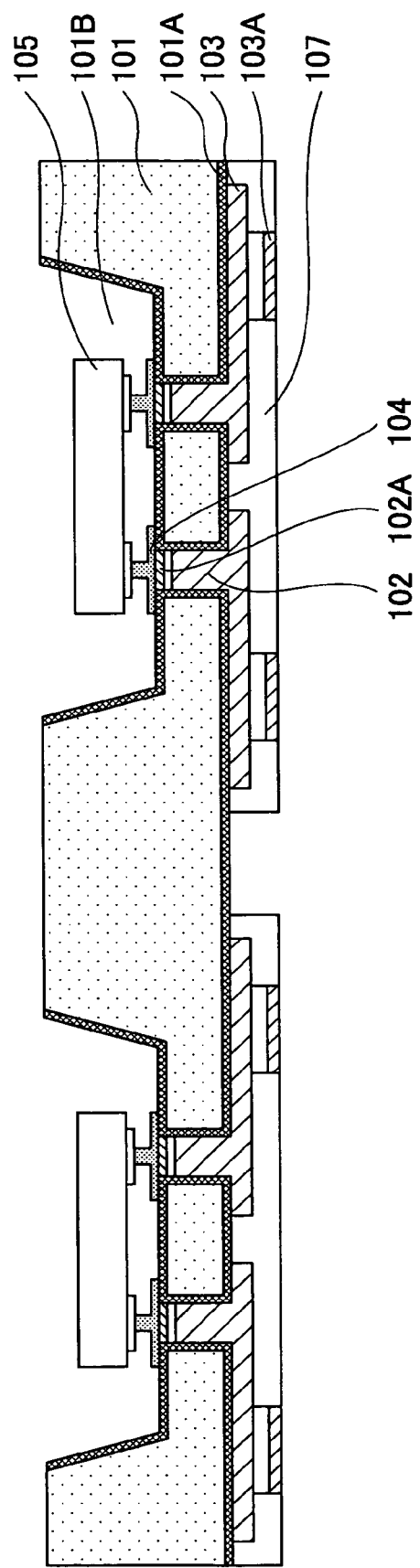
FIG. 2G is a (seventh) diagram showing a method for manufacturing a semiconductor device according to example 1 of the present invention.

Next, in a step shown in FIG. 2G, a semiconductor element 105 made of an optical functional element is flip-chip mounted on each of the plurally formed concave portions 101B such that the semiconductor element 105 is connected to the via plug 102 via the bump 104 (the connection layer 102A). In this case, connection pads made of Au or Al, for example, and formed on the semiconductor element 105 are bonded to the bumps 104 by ultrasonic waves.

Examples of the optical functional element mounted as the semiconductor element 105 include a light-emitting element and a light-receiving element (a photoelectric conversion element). Preferably, an LED is used as the light-emitting element, for example, so as to reduce electric power consumption.

Figure 2H:
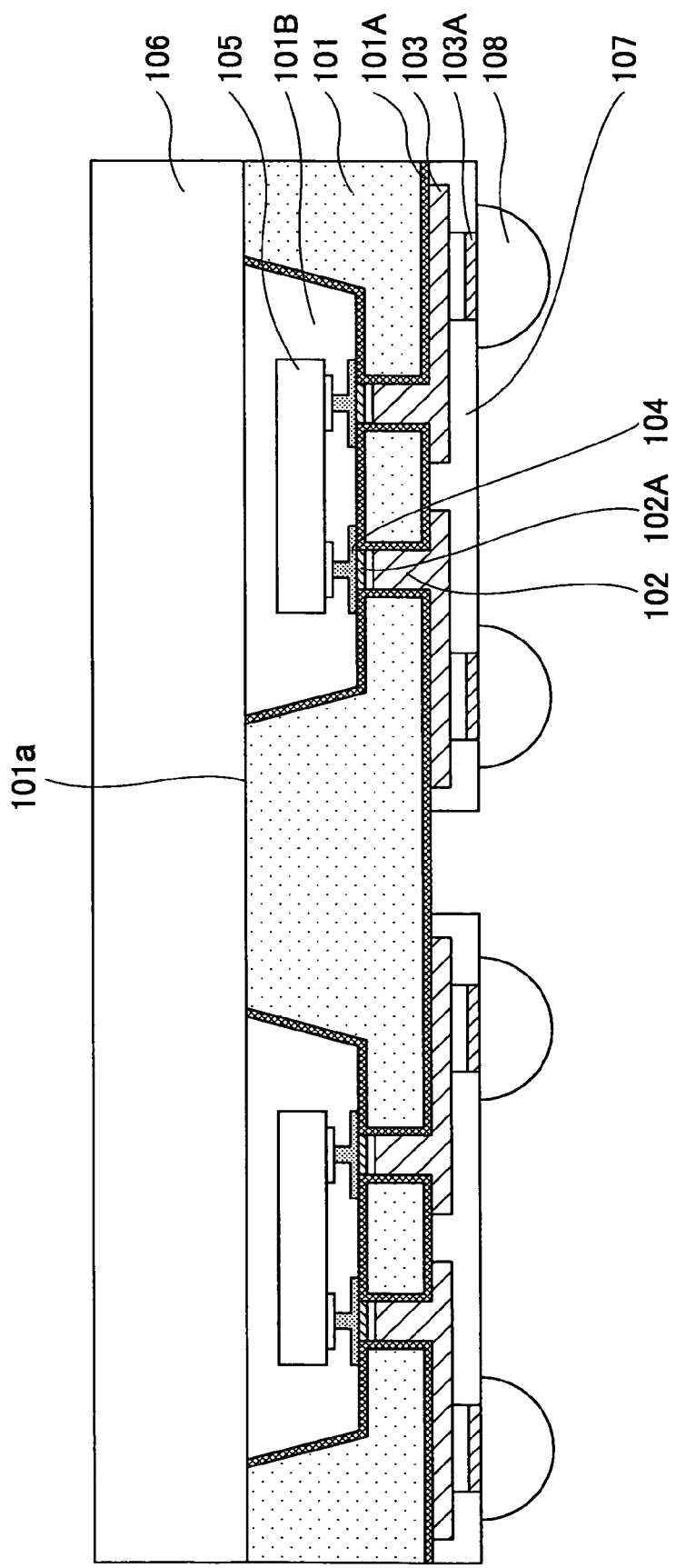
FIG. 2H is an (eighth) diagram showing a method for manufacturing a semiconductor device according to example 1 of the present invention.

Next, in a step shown in FIG. 2H, a substrate (a second substrate) 106 made of an optically transparent material such as glass is bonded. The material of the substrate 106 is different from that of the substrate 101. In this case, the bonding surface 101a on the periphery of the above-mentioned concave portion 101B and the substrate 106 are bonded by anodic bonding, for example. In this manner, the semiconductor element 105 is encapsulated in each of plural spaces (the concave portions 101B) demarcated using the substrate 101 and the substrate 106, so that plural semiconductor devices are formed. Further, when the semiconductor element 105 is made of an optical functional element such as a light-emitting element, the substrate 106 is preferably made of an optically transparent material.

In addition, although a solder ball 108 is formed on the connection layer 103A as appropriate, the forming of the solder ball 108 may be omitted.

In steps shown in FIGS. 2I to 2N, the bonded substrate 101 and substrate 106 made of different materials are cut and semiconductor devices are individualized.

Figure 2I:
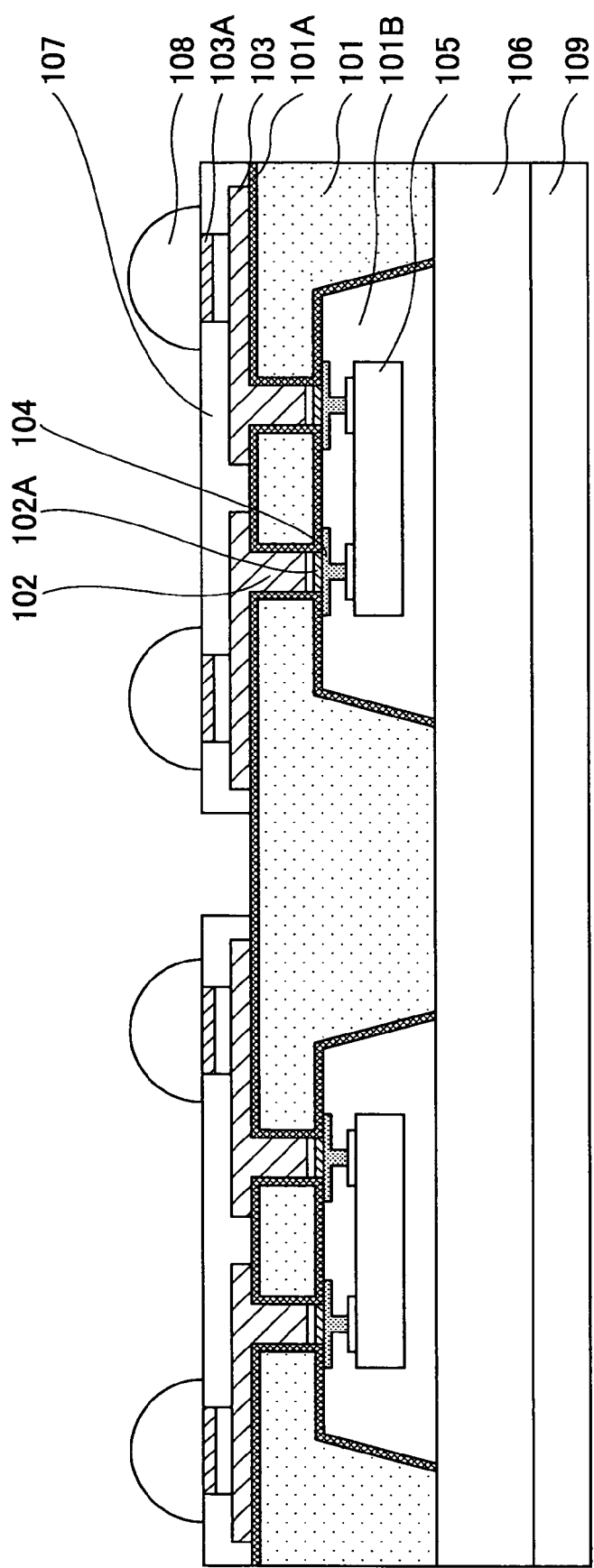
FIG. 2I is a (ninth) diagram showing a method for manufacturing a semiconductor device according to example 1 of the present invention.

First, in a step shown in FIG. 2I, a dicing tape 109 (made of an adhesive resin material) is attached to an outer surface of the substrate 106 (an opposite side of where the substrate 101 is bonded).

Figure 2J:
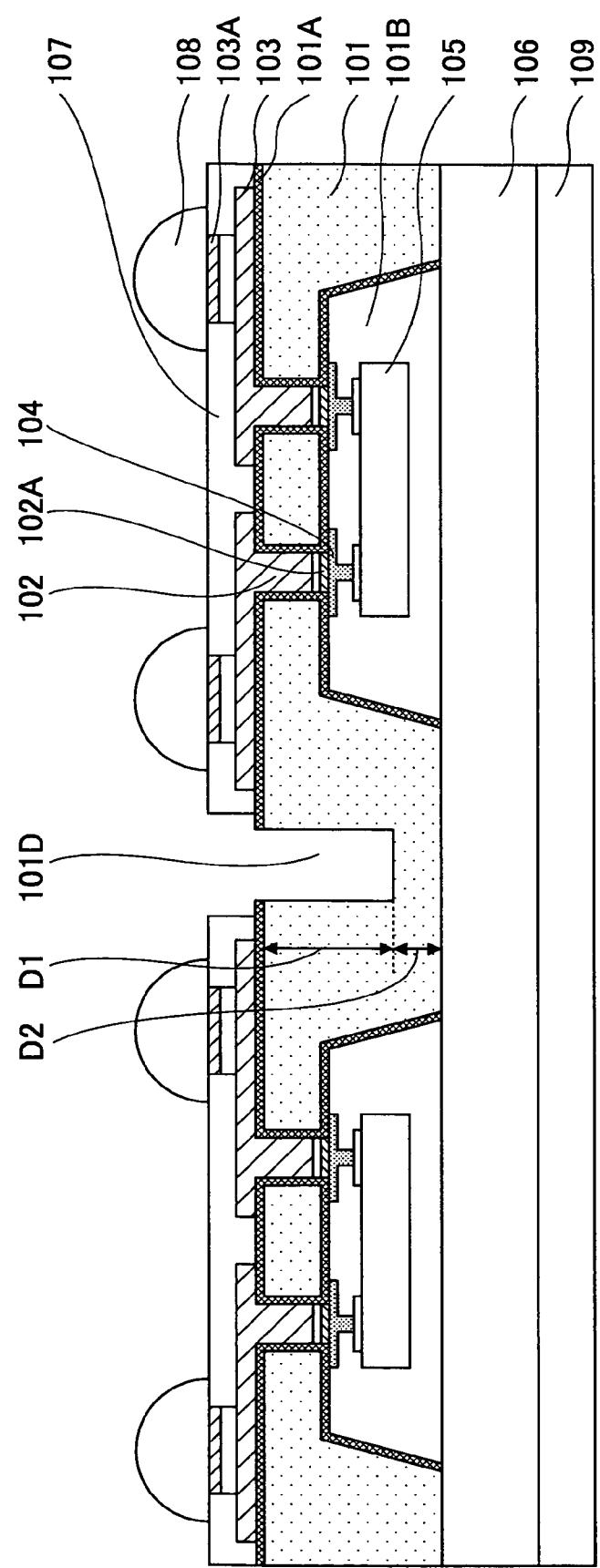
FIG. 2J is a (tenth) diagram showing a method for manufacturing a semiconductor device according to example 1 of the present invention.

Next, in a step shown in FIG. 2J, a groove (cutting) 101D with a depth D1 is formed by dicing from an outer surface of the substrate 101 (an opposite side of where the substrate 106 is bonded). In this case, when a thickness of the substrate 101 is assumed to be 200 μm, the depth D1 is made to be about 150 μm, for example, and a thickness D2 of the substrate 101 without the groove 101D is made to be about 50 μm. Thereafter, the dicing tape 109 is removed.

Figure 2K:
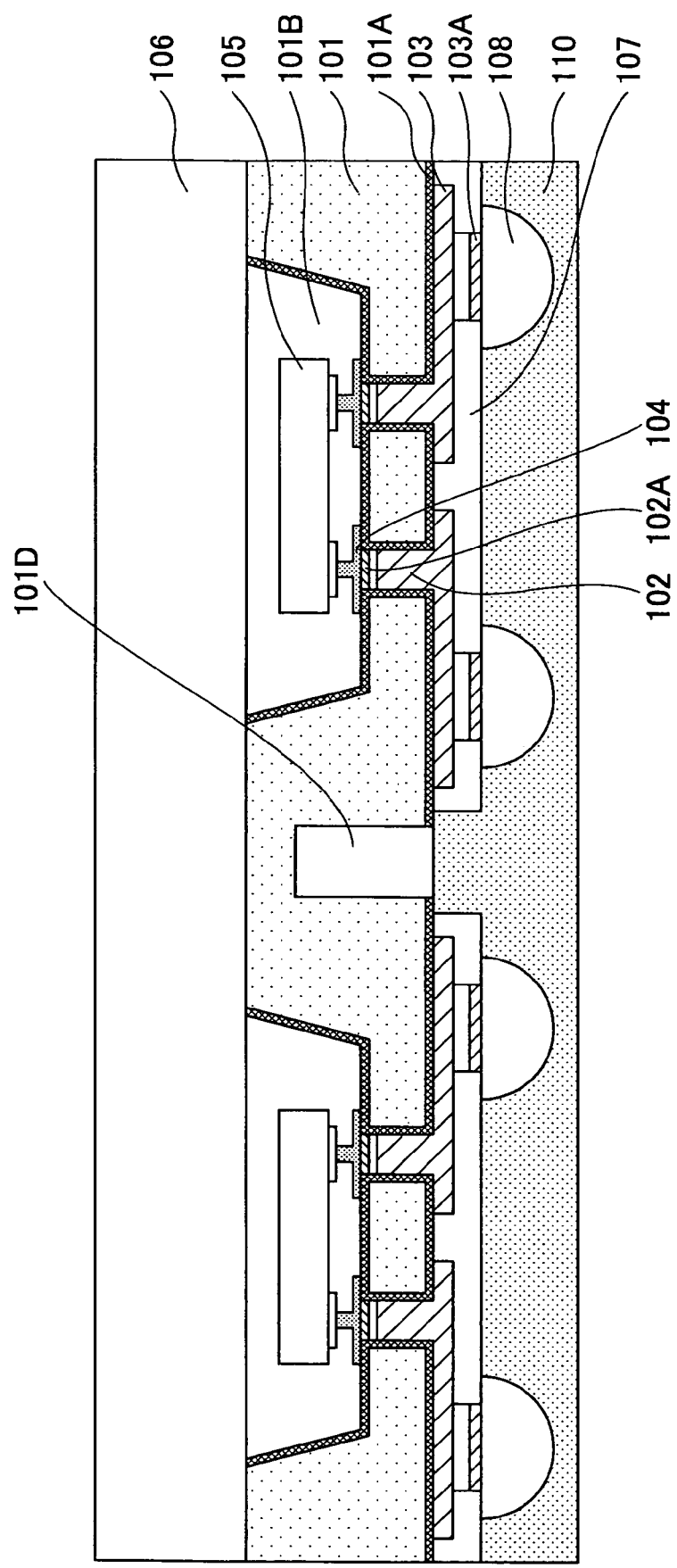
FIG. 2K is an (eleventh) diagram showing a method for manufacturing a semiconductor device according to example 1 of the present invention.

Next, in a step shown in FIG. 2K, a dicing tape 110 is attached to an outer surface of the substrate 101.

Figure 2L:
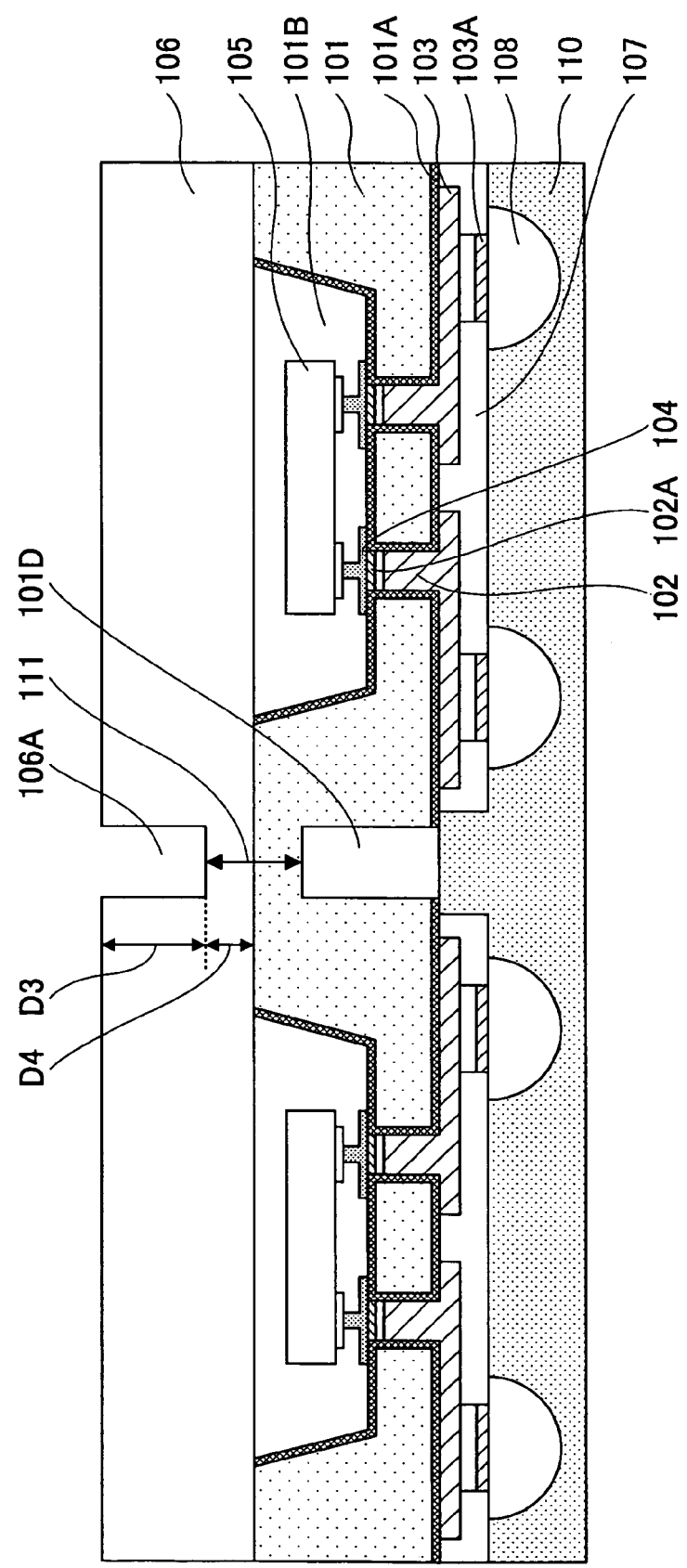
FIG. 2L is a (twelfth) diagram showing a method for manufacturing a semiconductor device according to example 1 of the present invention.

Next, in a step shown in FIG. 2L, a groove (cutting) 106A with a depth D3 is formed by dicing from the outer surface of the substrate 106 (the opposite side of where the substrate 101 is bonded). In this case, when a thickness of the substrate 106 is assumed to be 200 μm, the depth D3 is made to be about 150 μm, for example, and a thickness D4 of the substrate 106 without the groove 106A is made to be about 50 μm. In other words, a connection portion 111 made of the substrate 101 with the thickness of 50 μm and the substrate 106 with the thickness of 50 μm is formed between the groove 101D and the groove 106A.

Next, in a step shown in FIG. 2M, the dicing tape 110 is stretched by pulling or stress is applied to the substrate 106 (the substrate 101) using a rubber roller, for example. In accordance with this, the connection portion 111 (the substrate 101 and the substrate 106) formed between the groove 101D and the groove 106A is cut through cleavage and semiconductor devices 100 are individualized.

Figure 2N:
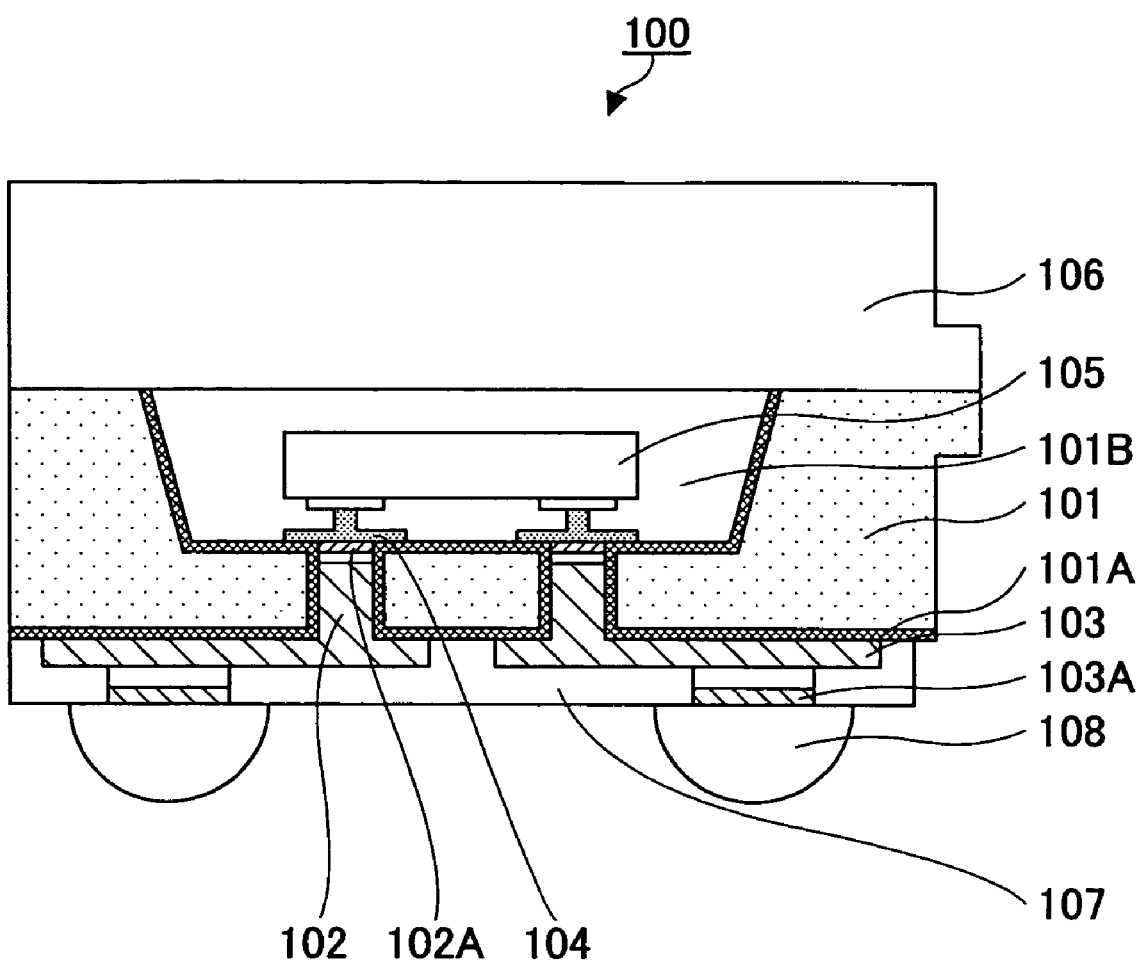
FIG. 2N is a (fourteen) diagram showing a method for manufacturing a semiconductor device according to example 1 of the present invention.

Next, in a step shown in FIG. 2N, the individualized semiconductor devices 100 are removed from the dicing tape 110 using a unit such as a die picker. In this manner, it is possible to form the semiconductor devices 100 according to the present invention.

According to the method for manufacturing a semiconductor device in the present example, it is possible to prevent the generation of chipping that has been problematic in cutting by conventional dicing. And it is possible to prevent the generation of a crack or failure of a semiconductor device resulting from the chipping. Thus, it is possible to manufacture a semiconductor device with preferable reliability.

In particular, in a structure in which substrates made of different materials are bonded, conventional individualization methods require different blades in some cases. In accordance with this, chipping is more likely to be generated, so that reliability of a semiconductor device may be reduced in some cases.

For example, when the semiconductor element made of an optical functional element is encapsulated as in the semiconductor device according to the present example, preferably, a substrate made of an optically transparent material such as glass is used. Further, preferably, a material suitable for mounting such as Si is used for the substrate on which the semiconductor device is mounted, the substrate being bonded to the substrate made of the optically transparent material.

In this manner, preferably, the semiconductor device according to the present example has the structure where the substrates made of different materials are bonded and it is necessary to individualize such a structure. In view of this, in the present example, when individualizing the structure where the first substrate (the substrate 101) and the second substrate (the substrate 106) made of different materials are bonded, the first groove (the groove 101D) is formed on the first substrate and the second groove (the groove 106A) is formed on the second substrate. Then, the portion between the first groove and the second groove (the connection portion 111) is cleaved, so that the first substrate and the second substrate are cut.

In accordance with this, the generation of a difference in level resulting from a change of dicing blades (blade width, for example) is eliminated on a cut surface resulting from the cutting. Moreover, the cut surface from cleavage is less likely to have protrusion or concavity and convexity formed thereon. A shape of the cut surface is preferable and chipping is less likely to be generated. Thus, it is possible to prevent the generation of a crack or failure and to manufacture a semiconductor device with preferable reliability.

Further, in the present example, when the mounted semiconductor element 105 is encapsulated, the substrate 101 made of Si and the substrate 106 made of glass are used, so that it is possible to bond the substrate 101 and the substrate 106 by anodic bonding. In accordance with this, it is possible to maintain a space where the semiconductor element 105 is encapsulated in a clean manner in comparison with a case where substrates are bonded using bond such as resin. And it is possible to maintain properties of the semiconductor element (optical functional element) 105 in a preferable manner.

Moreover, in the present example, the via plug 102 connected to the semiconductor element 105 and penetrating the substrate 101 is formed before the semiconductor element 105 is mounted, so that it is possible to manufacture a semiconductor device which readily enables connection between the semiconductor element 105 and a connection object (boards and the like).

Further, materials constituting the semiconductor device 100 according to the present example are not limited to the above-mentioned case and it is possible to form the semiconductor device 100 using various types of materials.

According to the present invention, it is possible provide a method for manufacturing a semiconductor device in which the generation of chipping when cutting substrates is prevented and a semiconductor device with preferable reliability is manufactured.

The present invention is not limited to the specifically disclosed embodiment, and variations and modifications may be made without departing from the scope of the present invention.

The present application is based on Japanese priority application No. 2006-001802 filed Jan. 6, 2006, the entire contents of which are hereby incorporated herein by reference.

What is claimed is:

1. A method for manufacturing a semiconductor device, the method comprising the steps of:

forming a plurality of concave portions on a front surface of a first substrate;

forming a wiring extending from the inside of the plural concave portions to a rear surface of the first substrate;

mounting a semiconductor element on each of the plural concave portions;

encapsulating the semiconductor element by bonding the front surface of the first substrate to a second substrate made of a material different from a material of the first substrate;

forming a first groove in the first substrate and a second groove in the second substrate; and individualizing the semiconductor device by cleaving a portion between the first groove and the second groove so as to individualize the semiconductor device;

wherein the individualized semiconductor device includes at least one of the concave portions on which the semiconductor element is mounted.

2. The method for manufacturing a semiconductor device according to claim 1, wherein the semiconductor element is made of an optical functional element.

3. The method for manufacturing a semiconductor device according to claim 2, wherein the second substrate is made of an optically transparent material.

4. The method for manufacturing a semiconductor device according to claim 1, wherein the first substrate and the second substrate are bonded by anodic bonding.

5. The method for manufacturing a semiconductor device according to claim 1, wherein the wiring penetrates the first substrate;

wherein the semiconductor element is connected to the wiring.

6. The method for manufacturing a semiconductor device according to claim 1, wherein a periphery of the concave portion of the front surface is bonded to the second substrate.

* * * * *